(12) United States Patent
Kumata (10) Patent No.: US 7,518,423 B2
(45) Date of Patent: Apr. 14, 2009

(54) DIGITAL DLL CIRCUIT FOR AN INTERFACE CIRCUIT IN A SEMICONDUCTOR MEMORY

(75) Inventor: Ichiro Kumata, Kanagawa (JP)

(73) Assignee: Sony Corporation (JP)

( * ) Notice: Subject to any disclaimer, the term of this patent is extended or adjusted under 35 U.S.C. 154(b) by 49 days.

(21) Appl. No.: 11/704,323

(22) Filed: Feb. 9, 2007

(65) Prior Publication Data
US 2007/0194822 A1     Aug. 23, 2007

(30) Foreign Application Priority Data
Feb. 21, 2006     (JP) ............................. 2006-043961

(51) Int. Cl.
*H03L 7/06* (2006.01)
(52) U.S. Cl. ...................... 327/158; 327/159; 327/160; 327/161
(58) Field of Classification Search .......... 327/158–161
See application file for complete search history.

(56) References Cited

U.S. PATENT DOCUMENTS 6,211,739 B1 * 4/2001 Synder et al. ............... 331/1 A
6,480,047 B2 * 11/2002 Abdel-Maguid et al. .... 327/161

FOREIGN PATENT DOCUMENTS

| JP | 2004-531981 | 10/2004 |
| JP | 2005-142859 | 6/2005 |

* cited by examiner

*Primary Examiner*—Kenneth B Wells
*Assistant Examiner*—John W Poos
(74) *Attorney, Agent, or Firm*—Rader Fishman & Grauer PLLC; Ronald P. Kananen (57) ABSTRACT

A digital DLL circuit includes: a register configured to hold a delay target value; an oscillator; a first counter configured to count an external reference clock or an oscillation output from the oscillator; a second counter configured to count the oscillation output from the oscillator or the external reference clock in every measurement cycle determined by the first counter; and a digitally-controlled variable delay circuit. The DLL circuit further includes a control circuit configured to control the reset and activation of the first counter and the second counter, and control the stop of the first and second counters according to need, based on a count value of the first counter, the control circuit subjecting a count value of the second counter and the delay target value of the register to a digital arithmetic operation, and supplying the variable delay circuit with a result of the arithmetic operation as a delay control value.

4 Claims, 7 Drawing Sheets

DIGITAL DLL CIRCUIT FOR AN INTERFACE CIRCUIT IN A SEMICONDUCTOR MEMORY

CROSS REFERENCES TO RELATED APPLICATIONS

The present invention contains subject matter related to Japanese Patent Application JP 2006-043961 filed with the Japanese Patent Office on Feb. 21, 2006, the entire contents of which are incorporated herein by reference.

BACKGROUND OF THE INVENTION

1. Field of the Invention

The present invention relates to a digital delay locked loop (DLL) circuit that is applicable to an interface circuit for a memory such as a DRAM.

2. Description of the Related Art

The circuit delay inside aLSI fluctuates depending on the supply voltage, temperature, and variation in the process at the time of the fabrication.

The DLL circuit is used to suppress the fluctuation to thereby realize a desired stable delay.

The DLL is a technique to regulate based on its circuit configuration the amount of the delay (time difference) arising between a clock signal from the external of the chip and a clock signal inside the chip, and thereby it can realize a short clock access time and a high operating frequency. The DLL circuit is used for, e.g., an interface circuit for a DRAM.

Various circuits have been proposed as this kind of DLL circuit (refer to, e.g. Japanese Patent Laid-open No. 2005-142859 (FIGS. 1 and 8) and Japanese Patent Laid-open No. 2004-531981 (FIGS. 1 and 3), hereinafter, referred to as Patent Document 1 and Patent Document 2, respectively.)

In the DLL circuits disclosed in Patent Document 1 and Patent Document 2, determinations as to the delay and phases for delay control are made by a phase comparison circuit.

As described above, in existing DLL circuits, determinations as to the delay and phases for delay control are made by a phase comparison circuit.

In many cases, the output of the phase comparison circuit is converted into an analog voltage by a charge pump so as to be used as a control signal for an analog-controlled variable delay circuit.

However, it is difficult for the analog system to implement a complicated control, such as the dynamic applying of a feedback control system, dependent upon the time passage after reset cancel and the delay fluctuation status.

Furthermore, to set different values as the delay target values of plural variable delay circuits, it is necessary for the DLL circuit to include plural control systems, such as phase comparison circuits.

In addition, if a digitally-controlled variable delay circuit is used, it is demanded that the output of a phase comparison circuit be treated as a binary value with coarse accuracy or that an analog-digital (A/D) conversion circuit be added so that the output is converted into a digital value as one of multiple values.

SUMMARY OF THE INVENTION

There is a need for the present invention to provide a digital DLL circuit that can easily obtain a delay feedback value with a simple configuration including no phase comparison circuit and so on and easily implement complicated control.

According to one embodiment of the present invention, there is provided a digital DLL circuit that includes a register configured to hold a delay target value, an oscillator, a first counter configured to count an external reference clock or an oscillation output from the oscillator in order to determine a measurement cycle, and a second counter configured to count the oscillation output from the oscillator or the external reference clock in every measurement cycle determined by the first counter. The digital DLL circuit further includes a digitally-controlled variable delay circuit, and a control circuit configured to control reset and activation of the first counter and the second counter, and control stop of the first and second counters according to need, based on a count value of the first counter. The control circuit subjects a count value of the second counter and the delay target value of the register to a digital arithmetic operation, and supplies the variable delay circuit with the result of the arithmetic operation as a delay control value.

According to embodiments of the present invention, a delay feedback value can be easily obtained with a simple configuration including no phase comparison circuit and so on, and complicated control can be easily implemented.

DETAILED DESCRIPTION OF THE PREFERRED EMBODIMENTS

Embodiments of the present invention will be described below in association with the accompanying drawings.

First Embodiment

Figure 1:
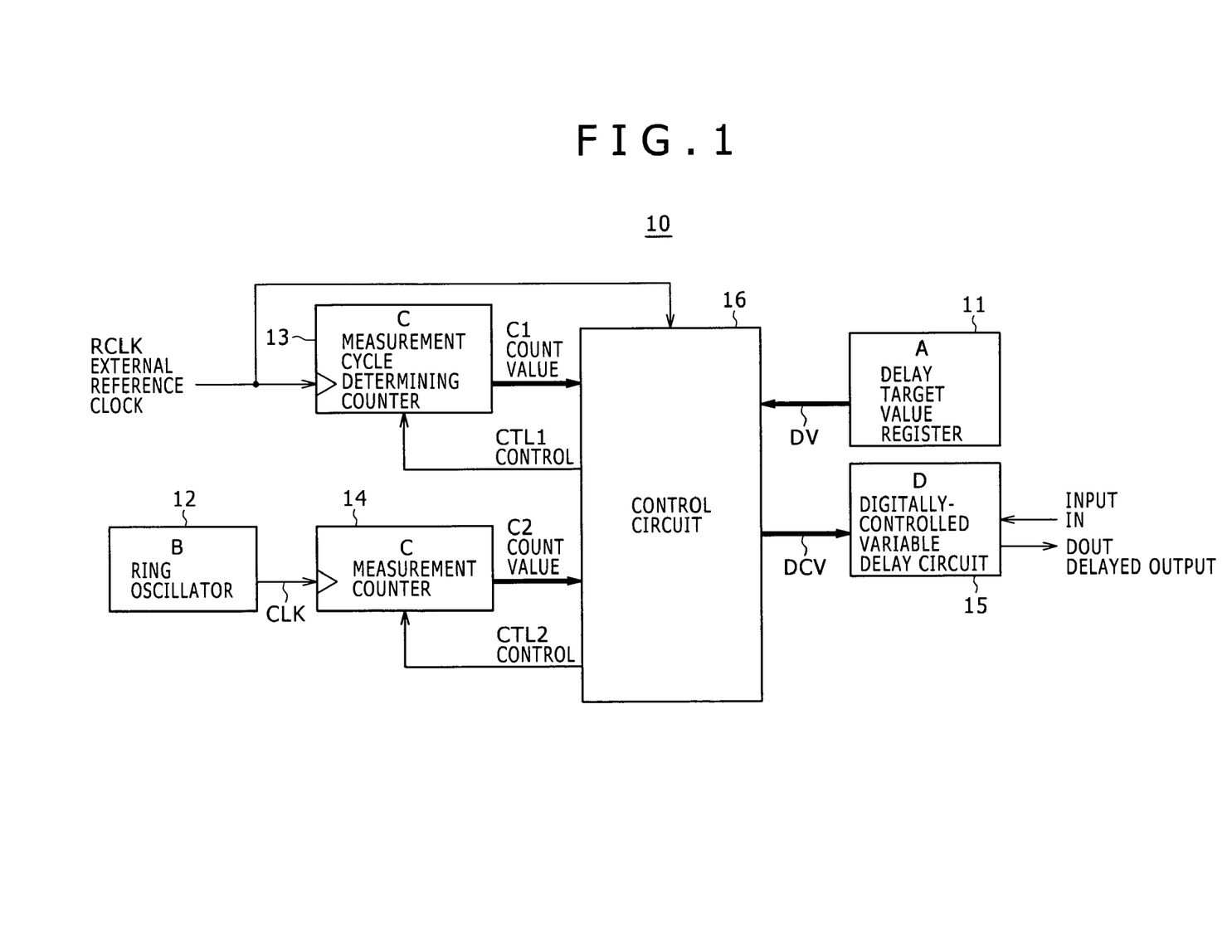
FIG. 1 is a block diagram showing a digital DLL circuit according to a first embodiment of the present invention.

FIG. 1 is a block diagram showing a digital DLL circuit according to a first embodiment of the present invention.

The digital DLL circuit of the first embodiment can easily obtain a delay feedback value with a simple configuration including no PLL (phase comparison circuit) and easily implement complicated control.

Referring to FIG. 1, a digital DLL circuit 10 includes a register 11, a ring oscillator 12, a first counter 13, a second counter 14, a digitally-controlled variable delay circuit 15, and a control circuit 16.

The register 11 holds a predefined delay target value.

The ring oscillator 12 generates a clock CLK of a predetermined frequency, and outputs the clock CLK to the second counter 14.

The first counter 13 counts a reference clock RCLK from the external of the IC in order to determine the measurement cycle, and outputs a count value C1 to the control circuit 16.

The second counter 14 counts the clock CLK generated and output by the ring oscillator 12 in every measurement cycle determined by the first counter 13, and outputs a count value C2 to the control circuit 16.

The digitally-controlled variable delay circuit 15 delays input data IN by the delay amount dependent upon a delay control value supplied from the control circuit 16, to thereby obtain a delayed output DOUT.

Figure 2:
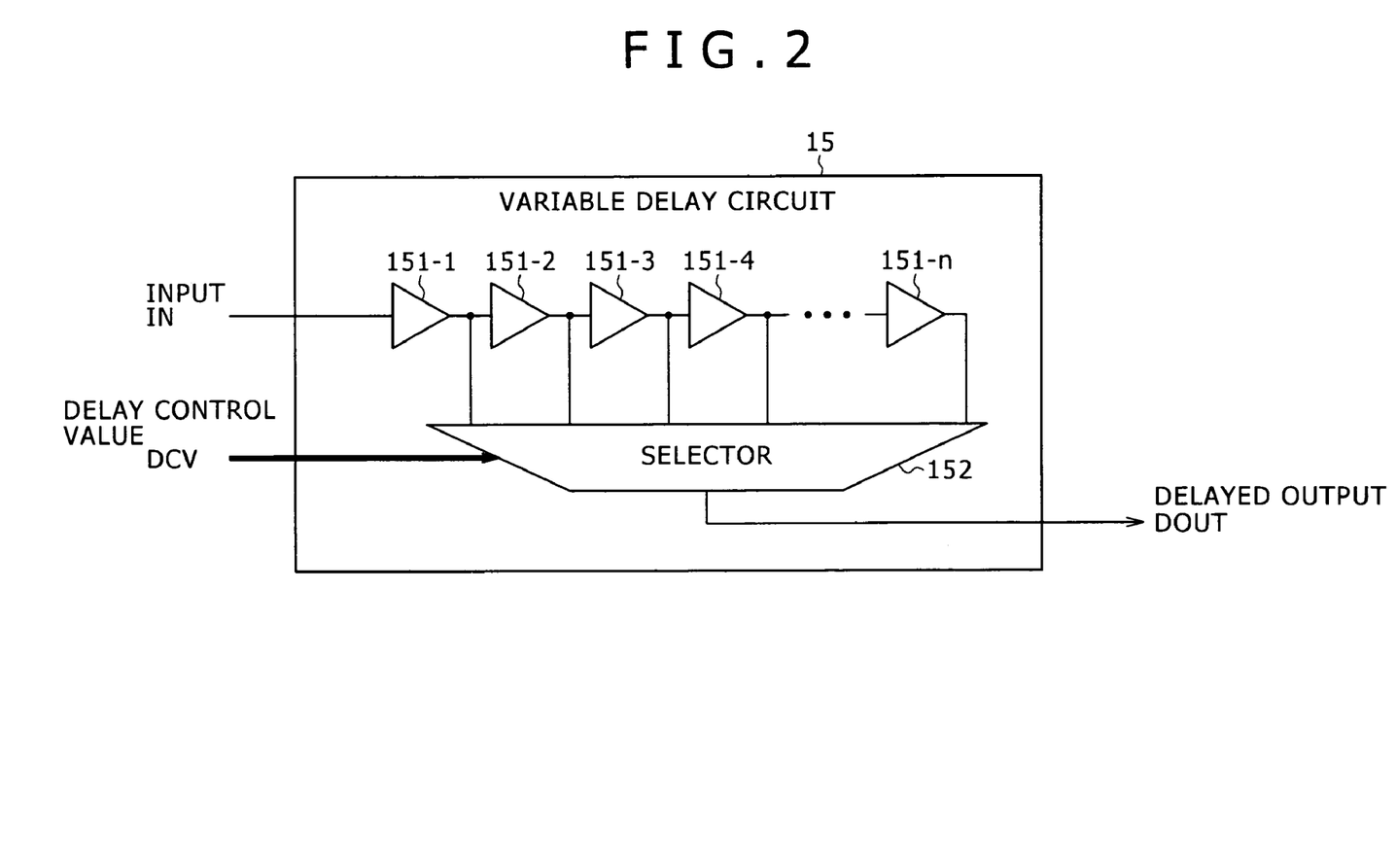
FIG. 2 is a diagram conceptually showing a configuration example of a digitally-controlled variable delay circuit according to an embodiment of the invention.

FIG. 2 is a diagram conceptually showing a configuration example of the digitally-controlled variable delay circuit 15.

The variable delay circuit 15 in FIG. 2 includes plural delay elements 151-1 to 151-n that are cascaded to the input IN, and a selector 152 that selects the output of either one of the delay elements 151-1 to 151-n depending on a delay control value DCV supplied from the control circuit 16 to thereby obtain the delayed output DOUT.

Based on the count value C1 of the first counter 13, the control circuit 16 controls the reset and activation of the first counter 13 and the second counter 14, and controls the stop of the counters 13 and 14 according to need, through control signals CTL1 and CTL2. Furthermore, the control circuit 16 subjects the count value C2 of the second counter 14 and the delay target value DV of the register to a digital arithmetic operation, and supplies the variable delay circuit 15 with the operation result as the delay control value DCV.

In the digital DLL circuit 10 having the above-described configuration, if the ring oscillator 12 and the variable delay circuit 15 are disposed close to each other in the same LSI and the configurations of the delay gates in the ring oscillator 12 and the variable delay circuit 15 are made similar to each other, the influence on delay by the supply voltage and temperature inside the LSI and process variation determined at the time of the fabrication in the ring oscillator 12 is almost the same as that in the variable delay circuit 15.

Accordingly, the ratio between the oscillation cycle of the ring oscillator 12 and the delay amount of the variable delay circuit 15 is invariably almost constant.

Therefore, measuring the oscillation cycle of the ring oscillator 12 or the oscillation frequency thereof, which is the inverse number of the oscillation cycle, allows the delay value of the variable delay circuit 15 to be found through a proportional calculation.

From the delay target value DV and the current delay value of the variable delay circuit 15, the delay control value (feedback amount) DCV to be supplied to the variable delay circuit 15 can be calculated.

In the first embodiment, the first counter 13 and the second counter 14 are employed for the measurement of the oscillation cycle or oscillation frequency of the ring oscillator 12.

The operation of the digital DLL circuit 10 according to the embodiment will be described below, with a focus on the control operation of the control circuit 16, in association with the flowchart of FIG. 3.

Upon the start of a measurement loop (ST10), the first counter 13 and the second counter 14 are initialized (reset) by the control signals CTL1 and CTL2 (ST11).

Subsequently, the first counter 13 starts counting the external reference clock RCLK, and the second counter 14 starts counting the clock CLk generated and output by the ring oscillator 12 (ST12).

Subsequently, whether or not the count value C1 of the first counter 13 has reached the maximum value (max) is determined (ST13). If Yes, the counting operation of the first counter 13 and the second counter 14 is stopped (ST14).

The count value C2 of the second counter 14 is then read out (ST15).

Subsequently, the process of calculating the delay control value (feedback amount) DCV is started (ST20), so that the delay target value DV of the register 11 and the second count value C2 are loaded in the control circuit 16 (ST21).

The loaded delay target value DV and the second count value C2 are subjected to a digital calculation so that the delay control value DCV of the variable delay circuit 15 is obtained (ST22), and this delay control value DCV is set in (supplied to) the variable delay circuit 15.

Figure 3:
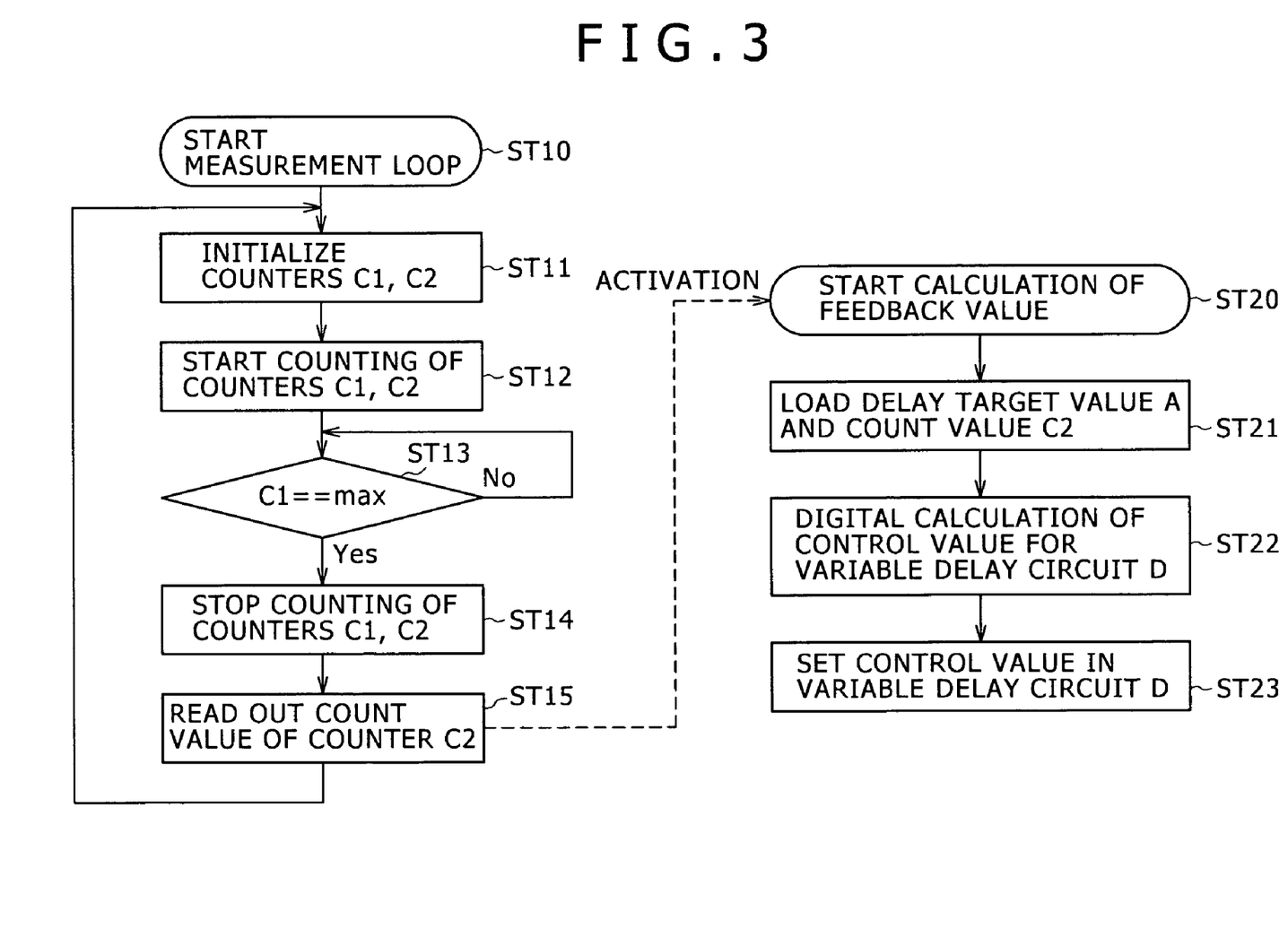
FIG. 3 is a flowchart for explaining the control operation of a digital DLL circuit according to an embodiment of the invention.

If the measurement cycle is determined based on the count value C1 of the first counter 13 and the count value C2 of the second counter 14 in one measurement cycle is read out in accordance with the operation flow of FIG. 3, the ratio between the cycles or frequencies of the externally input reference clock RCLK and the clock CLK generated by the ring oscillator 12 can be found.

From the ratio and the cycle or frequency of the reference clock RCLK, the cycle or frequency of the clock CLK generated by the ring oscillator 12 can be obtained.

Furthermore, the ratio between the cycle of the clock CLK generated by the ring oscillator 12 and the delay of the variable delay circuit can be found through, e.g., a delay analysis at the time of the LSI design. Therefore, as a result, the delay of the variable delay circuit 15 can be obtained.

As described above, according to the first embodiment, the digital DLL circuit 10 includes the register 11, the ring oscillator 12, the first counter 13, the second counter 14, the digitally-controlled variable delay circuit 15, and the control circuit 16. The register 11 holds a predefined delay target value. The ring oscillator 12 generates the clock CLK of a predetermined frequency. The first counter 13 counts the external reference clock RCLK to obtain the count value C1 in order to determine the measurement cycle. The second counter 14 counts the clock CLK generated and output by the ring oscillator 12 in every measurement cycle determined by the first counter 13, to thereby obtain the count value C2. The digitally-controlled variable delay circuit 15 delays the input data IN by the delay amount dependent upon the delay control value DCV to thereby obtain the delayed output DOUT. Based on the count value C1 of the first counter 13, the control circuit 16 controls the reset and activation of the first counter 13 and the second counter 14, and controls the stop of the counters 13 and 14 according to need, through the control signals CTL1 and CTL2. Furthermore, the control circuit 16 subjects the count value C2 of the second counter 14 and the delay target value DV of the register to a digital arithmetic operation, and supplies the variable delay circuit 15 with the operation result as the delay control value DCV. Therefore, the first embodiment can offer the following advantage.

Because the current delay value of the variable delay circuit 15 is compared with a delay target value and the control circuit 16 executes feedback through a digital arithmetic operation so that the delay value matches the delay target value, the delay of the variable delay circuit 15 is typically kept near the delay target value, which allows the digital DLL circuit 10 to function as a highly accurate DLL.

That is, a delay feedback value can be easily obtained with a simple configuration including no phase comparison circuit and so on, and complicated control can be easily implemented.

To enhance the accuracy of the delay control, the frequency of the clock used for the measurement is enhanced, or the period of one measurement is extended to increase the count value.

To increase the response speed, the clock frequency is enhanced with the accuracy being kept constant, or the accuracy is lowered with the clock frequency being kept the same.

Second Embodiment

Figure 4:
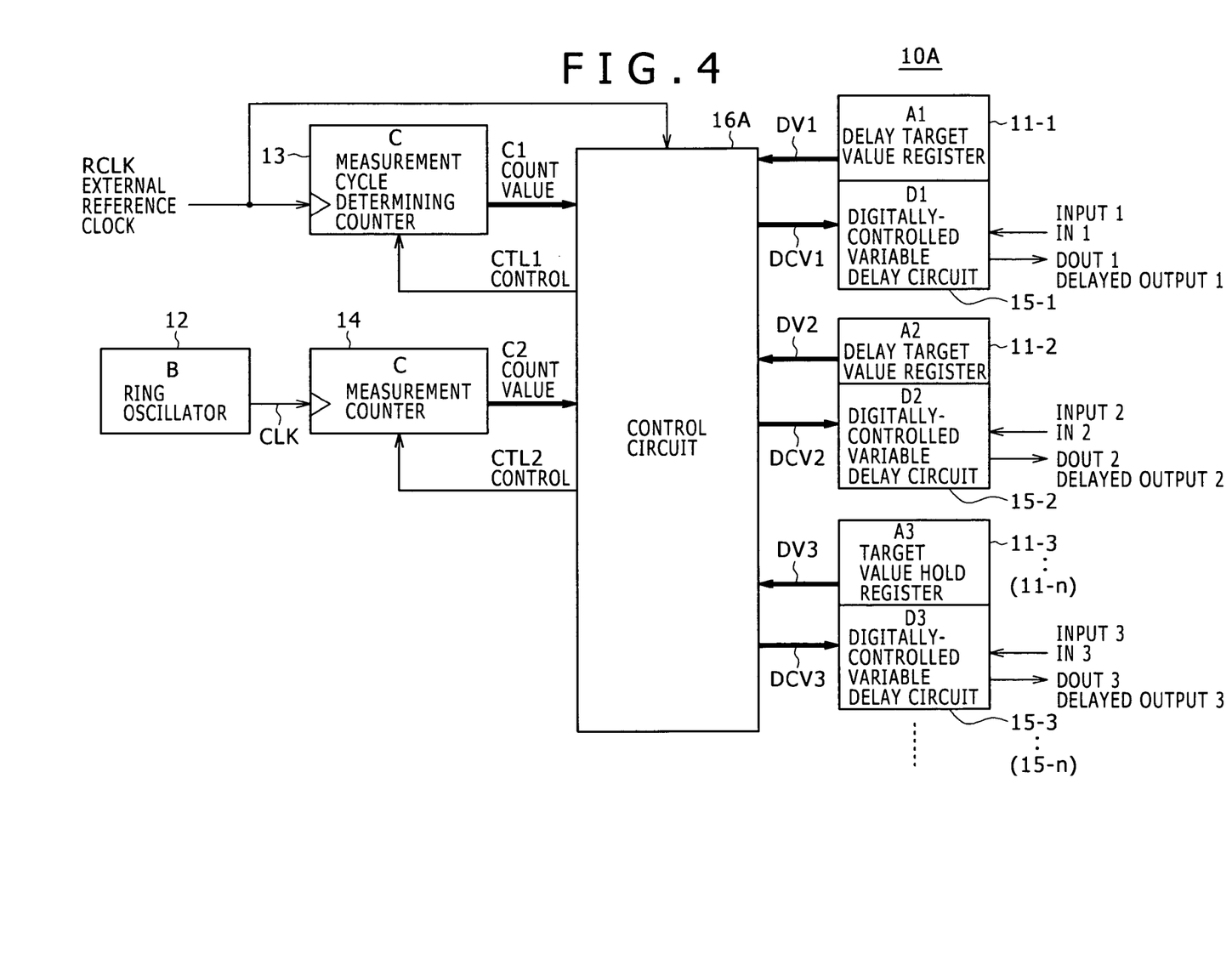
FIG. 4 is a block diagram showing a digital DLL circuit according to a second embodiment of the invention.

FIG. 4 is a block diagram showing a digital DLL circuit according to a second embodiment of the present invention.

A digital DLL circuit 10A of the second embodiment is different from the digital DLL circuit 10 of the first embodiment, in that the digital DLL circuit 10A includes plural (n) registers 11 that hold delay target values and plural (n) digitally-controlled variable delay circuits 15.

In this digital DLL circuit 10A, a control circuit 16A reads out delay target values DV1 to DVn of the plural registers 11-1 to 11-n. Furthermore, the control circuit 16A calculates the respective corresponding delay control values DCV1 to DCVn and supplies the calculated delay control values DCV1 to DCVn to the plural variable delay circuits 15-1 to 15-n, respectively.

That is, if a digital DLL circuit includes plural registers for holding delay target values and plural variable delay circuits like the second embodiment, the feedback control through digital arithmetic operation is carried out individually for each variable delay circuit so that the delay of each variable delay circuit is brought close to the corresponding delay target value.

The digital arithmetic operation may be executed in parallel by use of plural circuits.

It is more preferable that the scale of the digital arithmetic circuit is reduced by applying time division processing or pipeline processing that is generally used in digital arithmetic circuits.

Other configurations of the second embodiment are the same as those of the first embodiment, and therefore the second embodiment can offer the same advantages as those by the first embodiment.

Third Embodiment

Figure 5:
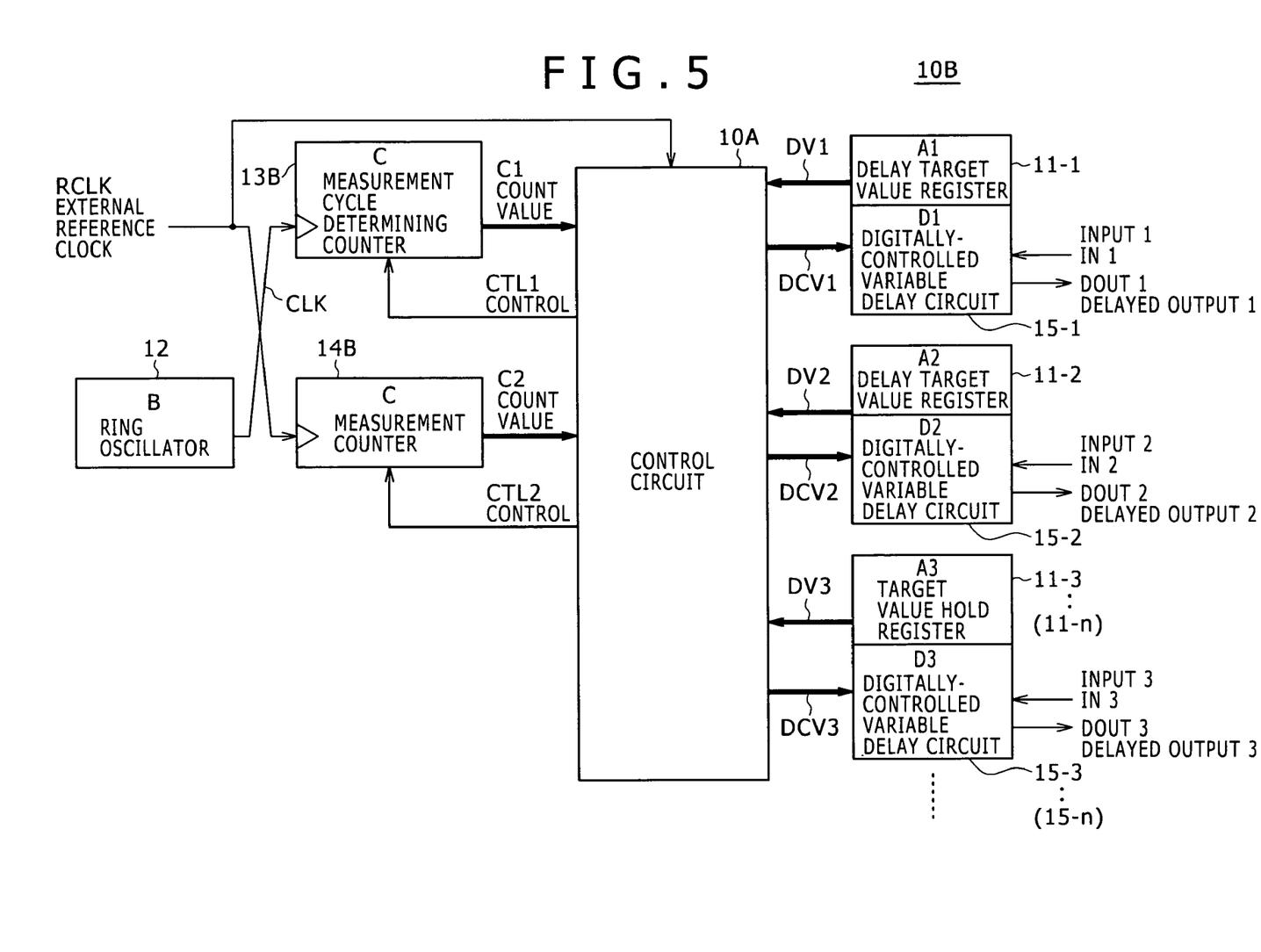
FIG. 5 is a block diagram showing a digital DLL circuit according to a third embodiment of the invention.

FIG. 5 is a block diagram showing a digital DLL circuit according to a third embodiment of the present invention.

A digital DLL circuit 10B of the third embodiment is different from the digital DLL circuit 10A of the second embodiment, in that the inputs of two counters 13B and 14B are interchanged in the digital DLL circuit 10B.

In this configuration, a count value C2 output by the second counter 14B is not proportional to the frequency of the measured clock but to the cycle thereof.

Other configurations of the third embodiment are the same as those of the second embodiment, and therefore the third embodiment can offer the same advantages as those by the first and second embodiments.

Figure 6:
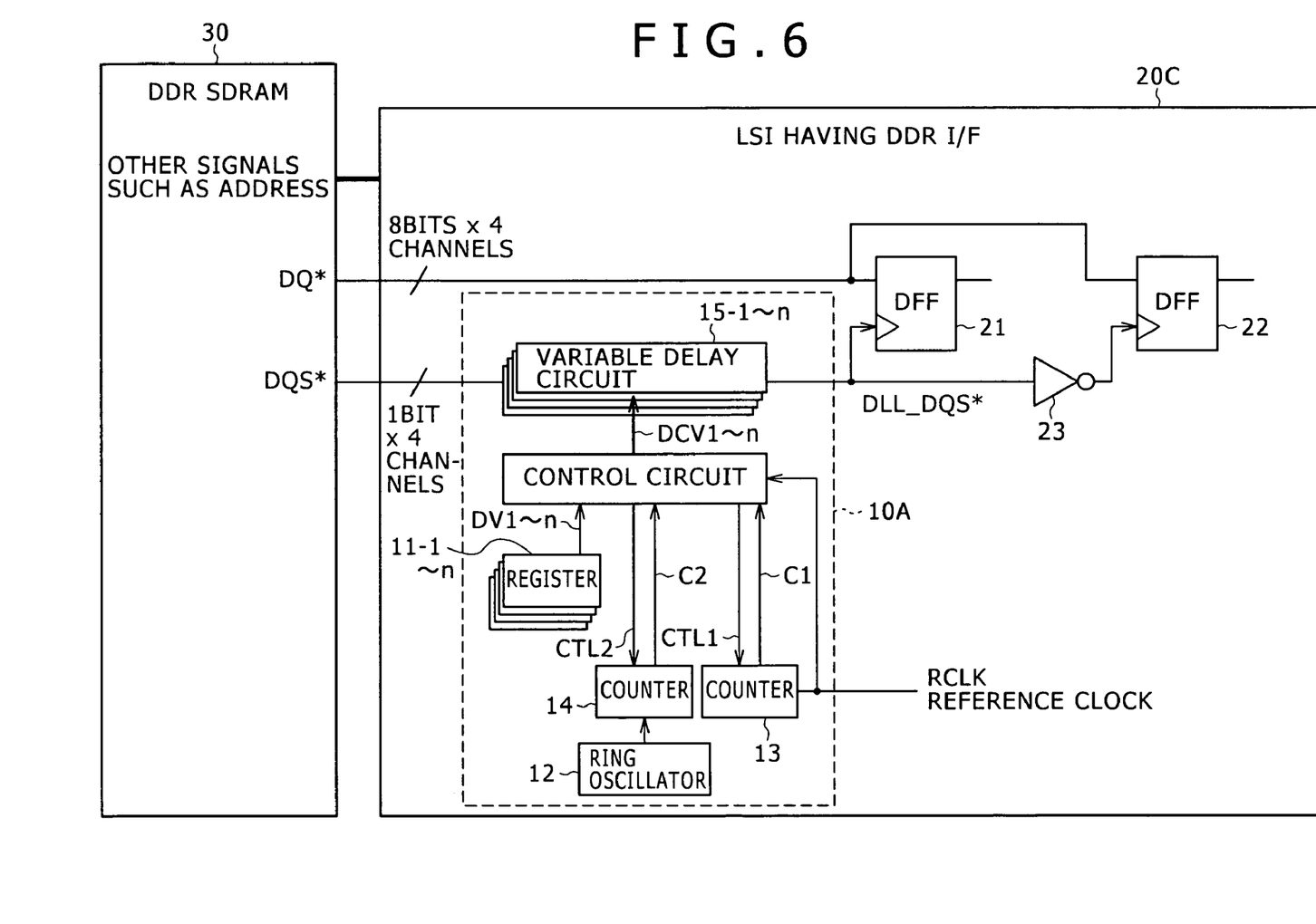
FIG. 6 is a diagram for explaining a DDR interface.
Figure 7A:
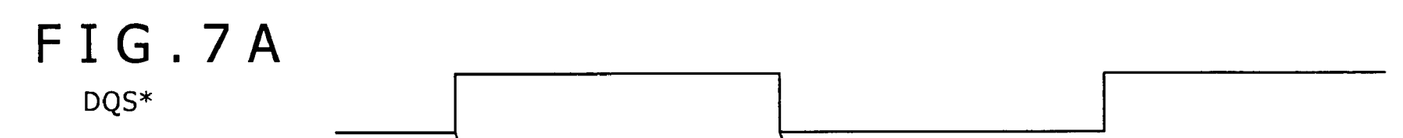
FIGS. 7A to 7D are a timing chart for explaining the operation of a DLL that functions as a DDR interface.
Figure 7B:
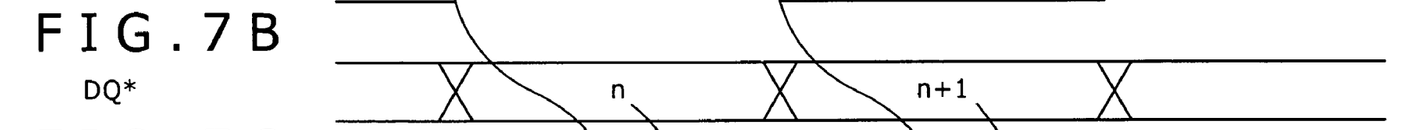
Figure 7C:
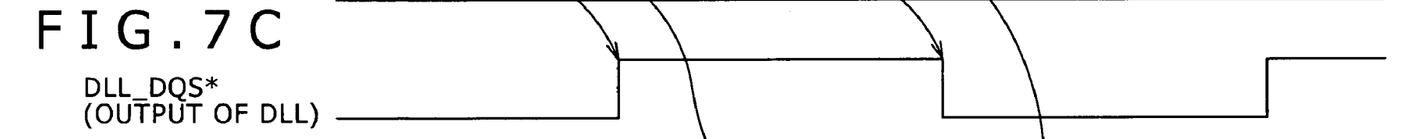
Figure 7D:
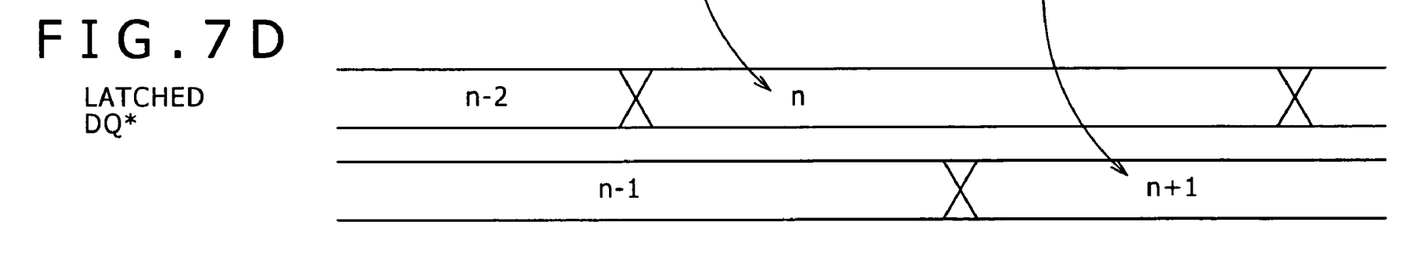

The digital DLL circuits 10, 10A, and 10B, having the above-described features, can be used as an interface circuit for a double data rate (DDR) DRAM like the one shown in FIG. 6, for example.

In FIG. 6, reference numeral 30 denotes a DDR synchronous DRAM (SDRAM), and numeral 20 denotes a certain LSI. Furthermore, numerals 21 and 22 denote D-type flip-flops, and numeral 23 denote an inverter.

In FIG. 6, an illustration of a power supply system is omitted.

FIGS. 7A to 7D are a timing chart for explaining the operation of the DLL that functions as a DDR interface.

When data is read out from the DDR SDRAM 30, a signal DQS* that indicates the timings of changes of read data DQ* is output for each certain group (e.g., for each 8 bits) of the read data DQ*.

To latch the read data inside the LSI 20, it is necessary that the signal DQS* be delayed by a period about one-fourth the clock cycle so as to be used as a load clock.

The digital DLL circuit 10A produces a stable delayed signal DQS for the latch.

In this manner, the digital DLL circuit can be applied as a DDR interface and produce a stable clock signal of which delay oscillation is small.

The above-described embodiments can offer the following advantages.

Specifically, because a delay or frequency is detected by counters without using a phase comparison circuit and a charge pump, the output of the control circuit is a digital value of plural bits indicating the absolute value of the delay or frequency. Therefore, it is easy to execute the digital arithmetic operation for a delay feedback value of the DLL.

Furthermore, for the digital arithmetic operation, it is easier to implement process porting, which is necessary in a process generation change, than for an analog circuit.

In addition, more complicated control can be easily carried out compared with that by an analog filter or the like that is used to implement feedback to a variable delay circuit based on an analog system.

Moreover, when the DLL circuit includes plural slave delay circuits, the respective different delay target values can be easily defined through the digital arithmetic operation.

Enhancement of the accuracy of the delay measurement and feedback can be easily realized by increasing the clock frequency or extending the measurement cycle.

In recent years, the use of high-speed memory interfaces and high-speed serial interfaces as substitutes for buses has been increasing, and hence digital DLL circuits like those of the embodiments are demanded for transmission and reception of data.

Compared with analog circuits, the areas of digital circuits are being rapidly reduced in step with generation changes of the semiconductor process technique. As the operation speed of LSIs becomes higher due to the generation changes of the process technique, the frequency of the reference clock used in the LSIs also becomes higher. Therefore, it is expected that the response speed and accuracy of the digital DLL circuits of the embodiments will be further enhanced, and thus the advantages of the circuits will become more significant in the future.

It should be understood by those skilled in the art that various modifications, combinations, sub-combinations and alterations may occur depending on design requirements and other factors insofar as they are within the scope of the appended claims or the

What is claimed is:

1. A digital DLL circuit comprising:
    a register configured to hold a delay target value;
    an oscillator;
    a first counter configured to count an external reference clock or an oscillation output from the oscillator in order to determine a measurement cycle;
    a second counter configured to count the oscillation output from the oscillator or the external reference clock in every measurement cycle determined by the first counter;
    a digitally-controlled variable delay circuit; and
    a control circuit configured to control the reset and activation of the first counter and the second counter, and control the stop of the first and second counters according to need, based on a count value of the first counter, the control circuit subjecting a count value of the second counter and the delay target value of the register to a digital arithmetic operation, and supplying the variable delay circuit with a result of the arithmetic operation as a delay control value.

2. The digital DLL circuit according to claim 1, wherein
a plurality of the registers that each holds a delay target value is included,
a plurality of the digitally-controlled variable delay circuits are included, and
the control circuit reads out the delay target values of the registers, and the control circuit calculates delay control values that each correspond to a respective one of the delay target values, and supplies the delay control values to the variable delay circuits.

3. The digital DLL circuit according to claim 1, wherein the oscillator is a ring oscillator.

4. The digital DLL circuit according to claim 2, wherein the oscillator is a ring oscillator.

* * * * *